(12) United States Patent
Kim (10) Patent No.: US 6,313,029 B1
(45) Date of Patent: Nov. 6, 2001

(54) METHOD FOR FORMING MULTI-LAYER INTERCONNECTION OF A SEMICONDUCTOR DEVICE

(75) Inventor: Jang Geun Kim, Kyoungki-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/606,874

(22) Filed: Jun. 28, 2000

(30) Foreign Application Priority Data

Jun. 29, 1999 (KR) .................................................. 99-25254

(51) Int. Cl.[7] .................................................. H01L 21/4763
(52) U.S. Cl. .......................... 438/637; 438/622; 438/623; 438/666; 438/667; 438/672
(58) Field of Search ..................................... 438/622, 623, 438/637, 666, 667, 672, 700

(56) References Cited

U.S. PATENT DOCUMENTS

| | | |
|---|---|---|
| 5,726,100 | 3/1998 | Givens . |
| 5,741,741 | 4/1998 | Tseng . |
| 5,932,928 | 8/1999 | Clampitt . |
| 5,985,746 | 11/1999 | Kapoor . |
| 6,008,114 * | 12/1999 | Li ........................................ 438/618 |
| 6,077,769 * | 6/2000 | Huang et al. ........................ 438/622 |
| 6,159,845 * | 12/2000 | Yew et al. ........................... 438/637 |
| 6,171,951 * | 1/2001 | Lee et al. ............................ 438/640 |
| 6,174,804 * | 1/2001 | Hsu .................................... 438/638 |
| 6,211,063 * | 4/2001 | Liu et al. ............................ 438/624 |

* cited by examiner

Primary Examiner—Long Pham

(57) ABSTRACT

Disclosed is a method for forming multi-layer interconnection of semiconductor device, which allows a contact hole to be formed at a size smaller than a resolution limit of the exposing system. The method comprises the steps of: providing a semiconductor substrate on which a first interconnection layer is formed; forming a first interlayer insulating film on the first interconnection layer and the semiconductor substrate; forming a patterned etch stopper layer on the first interlayer insulating film such that the etch stopper layer is overlapped with a portion of the first interconnection layer; forming a second interlayer insulating film on the etch stopper layer and the first interlayer insulating film; forming a photoresist pattern on the second interlayer insulating film in such a manner that a portion of the second interlayer insulating film, which is vertically overlapped with a portion of the first interconnection layer and a portion of the etch stopper layer including the portion overlapped with the first interconnection layer, is exposed; etching the second and first interlayer films using the photoresist pattern and the etch stopper layer such that a contact hole is formed through which the first interconnection layer and a portion of the etch stopper layer are exposed; removing the photoresist pattern; depositing a conductive film at a uniform thickness on the second interlayer insulating film, side walls of the contact hole, the first interconnection layer, and the etch stopper layer; and patterning the conductive film such that a second interconnection layer is formed that is in contact with the first interconnection layer.

12 Claims, 5 Drawing Sheets

METHOD FOR FORMING MULTI-LAYER INTERCONNECTION OF A SEMICONDUCTOR DEVICE

BACKGROUND OF THE INVENTION

1. Field of the Invention

The present invention relates to a method for forming a multi-layer interconnection of a semiconductor device, and more particularly relates to a method for forming micro-size contact holes for the electrical connection between lower and upper interconnection layers fitted with the fabrication of highly integrated semiconductor devices.

2. Description of the Prior Art

Generally, a semiconductor device is fabricated in the multi-layer interconnection structure. In this multi-layer interconnection structure, a lower interconnection layer and an upper interconnection layer are electrically isolated by an insulating layer having a contact hole, and are electrically connected through the contact hole to each other.

The conventional method for forming the multi-layer interconnection structure will now be described. First, there is provided a semiconductor substrate on which a lower interconnection layer covered by an insulating film is formed. The lower interconnection layer is a metal interconnection or an impurity diffusion region. A contact mask such as a photoresist pattern is then formed on the insulating film. By etching the exposed portion of the insulating film, a contact hole is formed in the insulating film in such a manner that the lower interconnection layer is partially exposed. In the contact hole, there is a contact layer formed in such a manner that it is in contact with the lower interconnection layer. Then, an upper interconnection layer is formed on the insulating film in such a manner that it is in contact with the contact layer.

The contact hole and the contact layer may be formed by a damascene process. In this damascene process, the contact hole is first defined in the insulating layer. A conductive layer is deposited on the insulating film in such a manner that it buries the contact hole. Then, the portion of the conductive layer protruded from the insulating film is removed, thereby forming the contact layer.

In the forming method of the multi-layer interconnection as described above, the contact hole is formed through masking and etching processes. In this case, a realizable size of the contact hole is dependent on a resolution of an exposing system. Namely, the size of the contact hole is limited by an aperture pattern formed on a contact mask, and the size of the aperture pattern formed on the contact mask is dependent on the resolution of the exposing system. For this reason, the realizable size of the contact hole is dependent on the resolution of the exposing system.

A certain size of the contact hole can be realized by the use of an existing exposing system. However, a contact hole having a more reduced size, that is, a micro-size contact hole capable of being fitted with a future tendency toward a high integration density and a design rule reduction, will be not defined, unless a new exposing system is provided.

SUMMARY OF THE INVENTION

It is therefore an object of the present invention to provide a method for forming multi-layer interconnection of semiconductor device, which method allows the formation of a micro-size contact hole fitted with the fabrication of a highly integrated semiconductor device, even by the use of an existing exposing system.

According to an embodiment of the present invention, there is provided a method for forming multi-layer interconnection of semiconductor device, comprising the steps of: providing a semiconductor substrate on which a first interconnection layer is formed; forming a first interlayer insulating film on the first interconnection layer and the semiconductor substrate; forming a patterned etch stopper layer on the first interlayer insulating film such that the etch stopper layer is overlapped with a portion of the first interconnection layer; forming a second interlayer insulating film on the etch stopper layer and the first interlayer insulating film; forming a photoresist pattern on the second interlayer insulating film, in such a manner that a portion of the second interlayer insulating film, which is vertically overlapped with a portion of the first interconnection layer and a portion of the etch stopper layer including the portion overlapped with the first interconnection layer, is exposed; etching the second and first interlayer films using the photoresist pattern and the etch stopper layer such that a contact hole is formed through which the first interconnection layer and a portion of the etch stopper layer are exposed; removing the photoresist pattern; depositing a conductive film at a uniform thickness on the second interlayer insulating film, side walls of the contact hole, the first interconnection layer, and the etch stopper layer; and patterning the conductive film such that a second interconnection layer is formed that is in contact with the first interconnection layer.

According to another embodiment of the present invention, there is provided a method for forming multi-layer interconnection of semiconductor device, comprising the steps of: providing a semiconductor substrate on which a first interconnection layer was formed; forming a inter-layer insulating film on the first interconnection layer and the semiconductor substrate; forming a patterned etch stopper layer on the interlayer insulating film such that it is overlapped with a portion of the first interconnection layer; forming a photoresist pattern on the resulting semiconductor substrate, in such a manner that a portion of the interlayer insulating film overlapped with the first interconnection layer, and a portion of the etch stopper layer including the portion overlapped with the first interconnection layer, are exposed; etching the interlayer insulating film using the photoresist pattern and the etch stopper layer such that a contact hole is formed through which the first interconnection layer is exposed; removing the photoresist pattern; depositing a conductive film on the interlayer insulating film and the etch stopper layer such that the contact hole is buried; planarizing the upper surface of the conductive film; and patterning the conductive film such that a second interconnection layer is formed that is in contact with the first interconnection layer.

BRIEF DESCRIPTION OF THE DRAWINGS

The above and other objects and aspects of the invention will be apparent from the,following description of embodiments with reference to the accompanying drawings, in which.

DETAILED DESCRIPTION OF THE PREFERRED EMBODIMENTS

Preferred embodiments of the present invention will now be described with reference to the accompanying drawings.

FIGS. 1A to 1D are cross-sectional views for illustrating a forming method of a multi-layer interconnection according to an embodiment of the present invention.

Figure 1A:
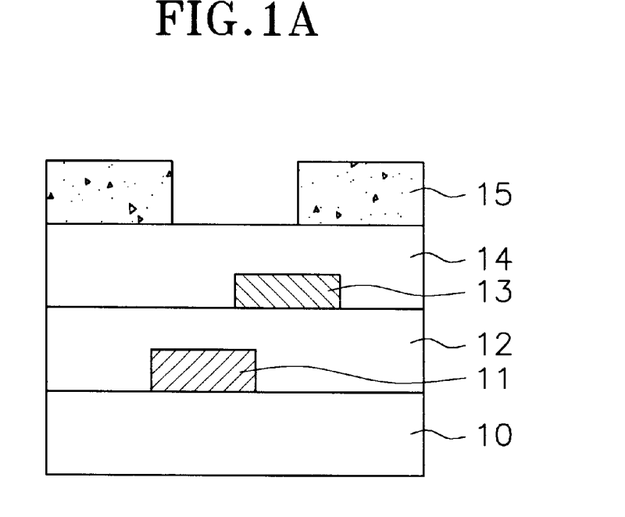
FIGS. 1A to 1D are cross-sectional views for illustrating a forming method of a multi-layer interconnection according to an embodiment of the present invention.

Referring to FIG. 1A, a semiconductor substrate 10 is first provided on which a first interconnection layer 11 is formed. The first interconnection layer 11 is either a conductive line made of polysilicon, metal silicide or metal, or an impurity diffusion region formed in the semiconductor substrate 10. On the first interconnection layer 11 and the semiconductor substrate 10, there is formed a first planarized interlayer insulating film 12. Then, a patterned etch stopper layer 13 is formed on the first interlayer insulating film 12 in such a fashion that it is overlapped with a portion of the first interconnection layer 11. A second interlayer insulating film 14 is formed on the etch stopper layer 13 and the first interlayer insulating film 12. Next, a photoresist pattern 15 as a contact mask is formed on the second interlayer insulating film by the conventional photolithography process. The photoresist pattern 15 is formed in such a manner that a portion of the second interlayer insulating film 14, which is vertically overlapped with a portion of the first interconnection layer 11 and a portion of the etch stopper layer 13 including the portion overlapped with the first interconnection layer, is exposed.

The first and second interlayer insulating films 12 and 14 are, for example, one selected from the group consisting of a TEOS film, a BPSG film, a high temperature oxide film, and a medium temperature oxide film, respectively. The etch stopper layer 13 consists of an insulating film or a conductive film, which has an etch selectivity different from that of the first and second interlayer insulating films 12 and 14. In this case, the insulating film can be, for example, a nitride film or oxynitride film. The conductive film can be, for example, a polysilicon film or a metal film.

Figure 1B:
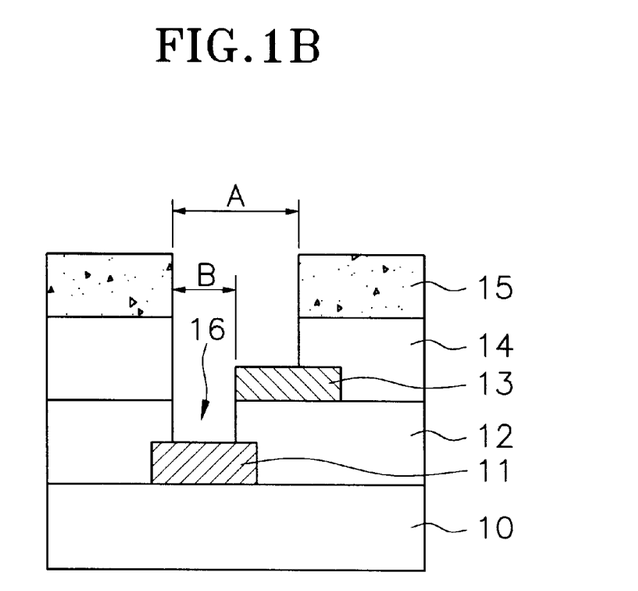

Referring to FIG. 1B, a contact hole 16 is formed by etching the second and first interlayer insulating films while using the photoresist pattern 15 and the etch stopper layer 13. Thus, a portion of the etch stopper layer 13 and a portion of the first interconnection layer 11 are exposed through the contact hole 16. In this contact hole 16, a width "B" of its lower height portion defined in the first interlayer film 12 is smaller than a width "A" of its upper height portion defined in the second interlayer insulating film 14. Consequently, assuming that the upper portion width "A" is a resolution limit size of the exposing system, the lower portion width "B" will be a size smaller than the resolution limit of the exposing system. As a result, the contact hole 16 can be formed to have a size smaller the resolution limit of the exposing system, even by the use of the existing exposure size.

Figure 1C:
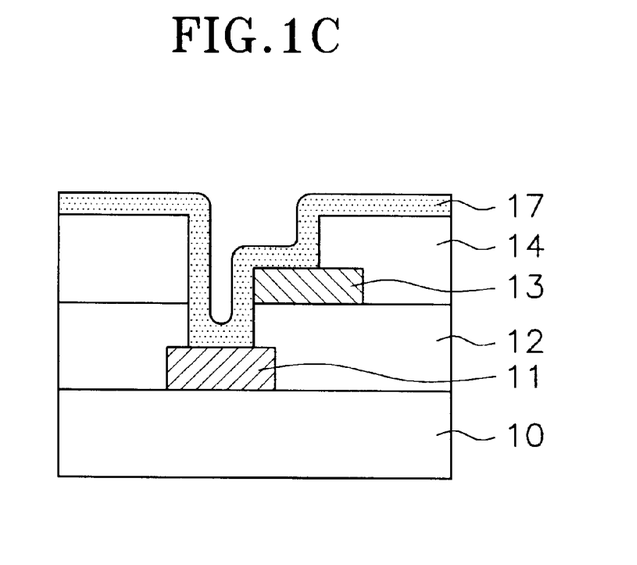

Referring to FIG. 1C, the photoresist pattern is removed. A conductive layer 17 is deposited on the second interlayer insulating film 14, the sidewalls of the contact hole 16, the exposed portion of the first interconnection layer 11 and the etch stopper layer 13, at a uniform thickness.

Figure 1D:
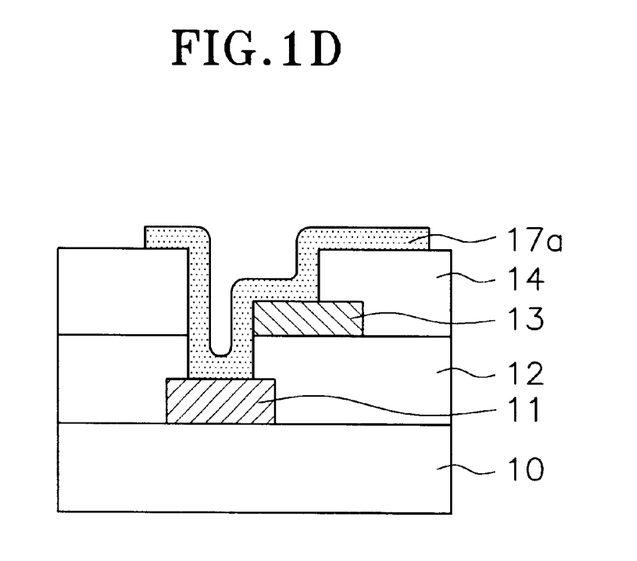

Referring to FIG. ID, the conductive layer 17 is patterned by the conventional process, thereby forming a second interconnection layer 17a that is in contact with the first interconnection layer.

According to the embodiment as described above, a contact hole having a size smaller than a resolution limit of the exposing system can be defined by forming the etch stopper layer 13 in such a manner that the etch stopper layer 13 is overlapped with a portion of the first interconnection layer 11. Accordingly, it is possible to form a micro-size contact hole fitted with the fabrication of highly integrated devices without a modification of the existing process.

Meanwhile, if the etch stopper layer 13 consists of an insulating layer, it serves as a simple etch stopper. However, if the etch stopper layer 13 consists of a conductive film, it, besides being the etch stopper, serves as an interconnection by itself. Accordingly, the etch stopper layer 13 consisting of the conductive film can be electrically connected to the first and second interconnection layers 12 and 17a by one time of a masking and etch process.

FIGS. 2A to 2E are cross-sectional views for the respective processes for illustrating a forming method of a multi-layer interconnection according to another embodiment of the present invention.

Figure 2A:
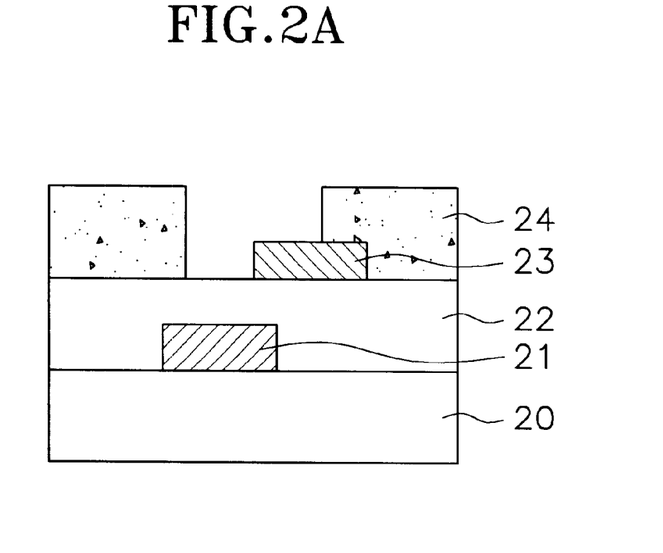
FIGS. 2A to 2E are cross-sectional views for illustrating a forming method of a multi-layer interconnection according to another embodiment of the present invention.

Referring to FIG. 2A, a semiconductor substrate 20 is first provided on which a first interconnection layer 21 is formed. A planarized interlayer insulating film 22 is formed on the first interconnection layer 21 and the semiconductor substrate 20. Then, a patterned etch stopper layer 23 is formed on the interlayer insulating film 22 in such a fashion that it is overlapped with a portion of the first interconnection layer 21. Next, a photoresist pattern 24 as a contact mask is formed on the resulting semiconductor substrate 20. This photoresist pattern 24 is formed in such a manner that a portion of the interlayer insulating film 22 overlapped with the first interconnection layer 21, and a portion of the etch stopper layer 23 including the portion overlapped with the first interconnection layer 21, are exposed.

The first interconnection layer 21 is either a conductive line made of polysilicon, metal silicide and metal, or an impurity diffusion region formed in the semiconductor substrate 20. The interlayer insulating film 22 is, for example, one selected from the group consisting of a TEOS film, a BPSG film, a high temperature oxide film, and a medium temperature oxide film. The etch stopper layer 23 is made of an insulating film or a conductive film, which has an etch selectivity different from that of the interlayer insulating film 22. In this case, the insulating film can be, for example, a nitride film or oxynitride film. The conductive film can be, for example, a polysilicon film or a metal film.

Figure 2B:
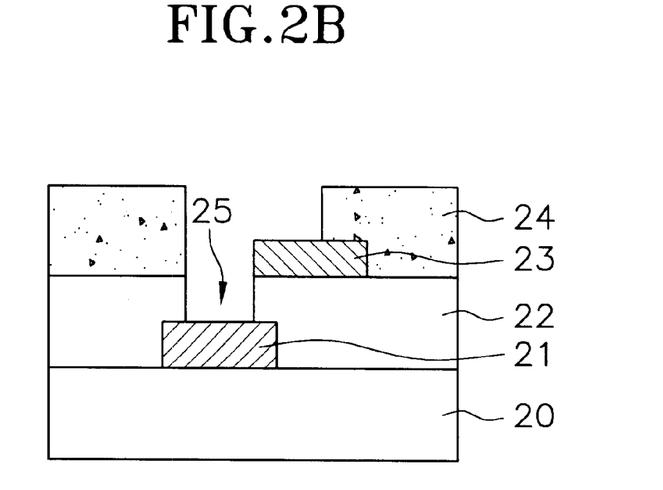

Referring to FIG. 2B, a contact hole 25 is formed by etching the interlayer insulating film 22 while using the photoresist pattern 24 and the etch stopper layer 23 as an etch barrier. This contact hole 25 has a smaller width than a width of an aperture pattern formed on the photoresist pattern 24. As a result, the contact hole 16 can be formed to have a size smaller than the resolution limit of the exposing system.

Figure 2C:
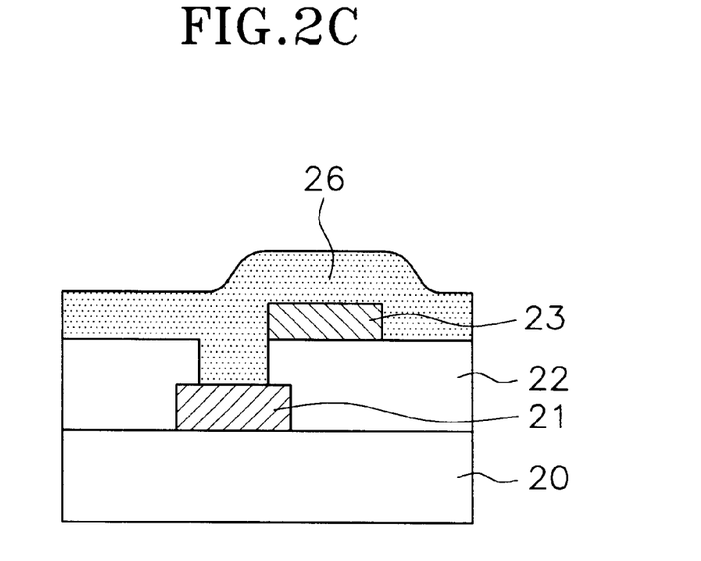
Figure 2D:
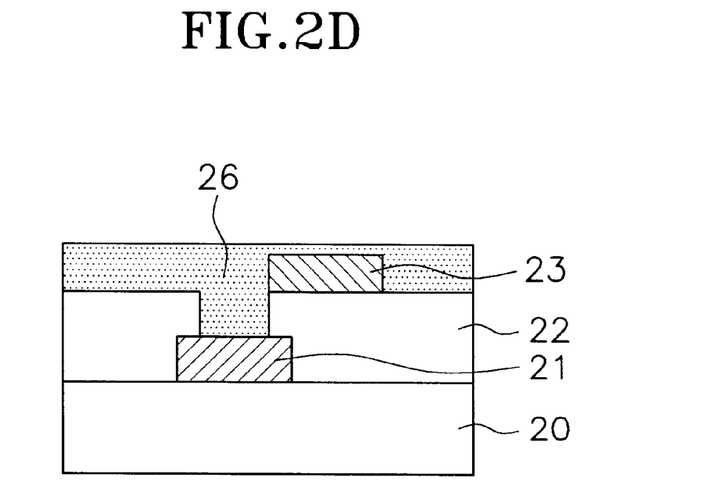

Referring to FIGS. 2C and 2D, the photoresist pattern is removed. A conductive layer 26 is deposited on the interlayer insulating film 22, after which the conductive film 26 is blanket-etched at its upper surface, thereby being planarized.

Figure 2E:
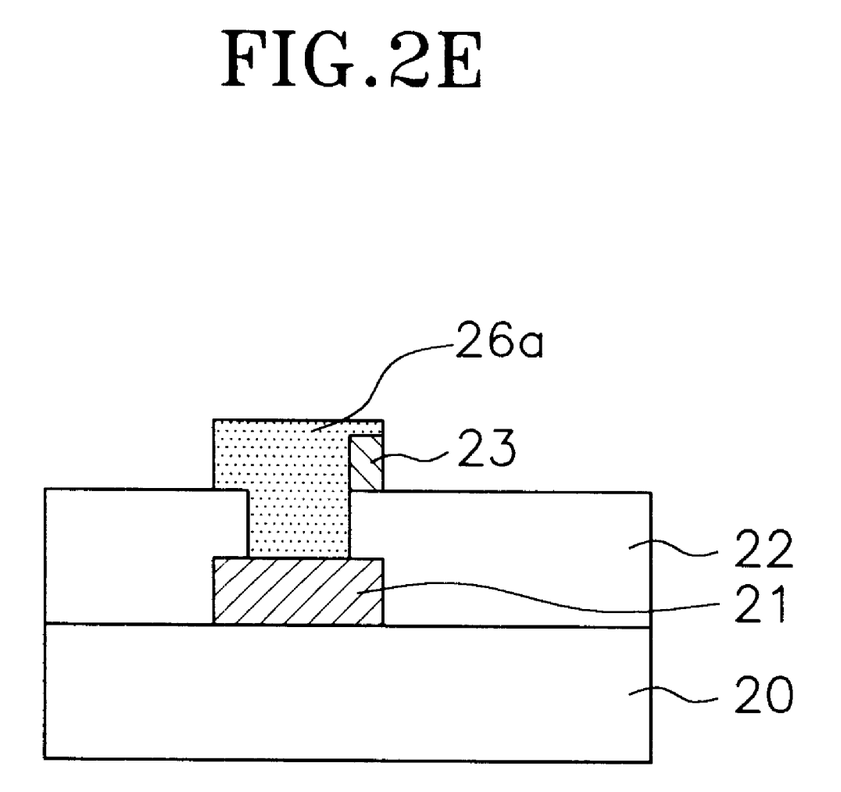

Referring to FIG. 2E, the conductive layer 26 is patterned by the conventional process, thereby forming a second interconnection layer 26a that is electrically connected to the first interconnection layer 21. Upon patterning the conductive film 26, the etch stopper layer 23 is preferably patterned together.

According to this embodiment, a contact hole having a size smaller than the resolution limit of the exposing system can be defined by forming the etch stopper layer 23 in such a manner that the etch stopper layer 23 is overlapped with a portion of the first interconnection layer 21, similarly with the first embodiment. Accordingly, it is possible to form a micro-size contact hole fitted with the fabrication of highly integrated devices without a modification of the existing process.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a multi-layer interconnection structure for a semiconductor device, comprising the steps of:

providing a semiconductor substrate on which a first interconnection layer is formed;

forming a first interlayer insulating film on the first interconnection layer and the semiconductor substrate;

forming a patterned etch stopper layer on the first interlayer insulating film such that the etch stopper layer is overlapped with a portion of the first interconnection layer;

forming a second interlayer insulating film on the etch stopper layer and the first interlayer insulating film;

forming a photoresist pattern on the second interlayer insulating film in such a manner that a portion of the second interlayer insulating film, which is vertically overlapped with a portion of the first interconnection layer and a portion of the etch stopper layer including the portion overlapped with the first interconnection layer, is exposed;

etching the second and first interlayer films using the photoresist pattern and the etch stopper layer such that a contact hole is formed through which the first interconnection layer and a portion of the etch stopper layer are exposed;

removing the photoresist pattern;

depositing a conductive film at a uniform thickness on the second interlayer insulating film, side walls of the contact hole, the first interconnection layer, and the etch stopper layer; and patterning the conductive film such that a second interconnection layer is formed that is in contact with the first interconnection layer.

2. The method of claim 1, wherein the first interconnection layer is a conductive line made of polysilicon, silicide, or metal.

3. The method of claim 1, wherein the first interconnection layer is an impurity diffusion region.

4. The method of claim 1, wherein the etch stopper layer consists of an insulating or conductive film, which has an etch selectivity different from that of the first and second interlayer insulating films.

5. The method of claim 4, wherein the insulating film consists of a nitride or oxynitride film.

6. The method of claim 4, wherein the conductive film consists of a polysilicon or metal film.

7. A method for forming a multi-layer interconnection structure for a semiconductor device, comprising the steps of:

providing a semiconductor substrate on which a first interconnection layer was formed;

forming a interlayer insulating film on the first interconnection layer and the semiconductor substrate;

forming a patterned etch stopper layer on the interlayer insulating film such that the etch stopper layer is overlapped with a portion of the first interconnection layer;

forming a photoresist pattern on the resulting semiconductor substrate in such a manner that a portion of the interlayer insulating film overlapped with the first interconnection layer, and a portion of the etch stopper layer including the portion overlapped with the first interconnection layer, are exposed;

etching the interlayer insulating film using the photoresist pattern and the etch stopper layer such that a contact hole is formed through which the first interconnection layer is exposed;

removing the photoresist pattern;

depositing a conductive film on the interlayer insulating film and the etch stopper layer such that the contact hole is buried;

planarizing the upper surface of the conductive film; and patterning the conductive film such that a second interconnection layer is formed that is in contact with the first interconnection layer.

8. The method of claim 7, wherein the first interconnection layer is a conductive line made of polysilicon, silicide, or metal.

9. The method of claim 7, wherein the first interconnection layer is an impurity diffusion region.

10. The method of claim 7, wherein the etch stopper layer consists of an insulating or conductive film, which has an etch selectivity different from that of the first and second interlayer insulating films.

11. The method of claim 10, wherein the insulating film consists of a nitride or oxynitride film.

12. The method of claim 10, wherein the conductive film consists of a polysilicon or metal film.

* * * * *

UNITED STATES PATENT AND TRADEMARK OFFICE
CERTIFICATE OF CORRECTION

| | | |
|---|---|---|
| PATENT NO. | : 6,313,029 B1 | Page 1 of 1 |
| APPLICATION NO. | : 09/606874 | |
| DATED | : November 6, 2001 | |
| INVENTOR(S) | : Kim | |

It is certified that error appears in the above-identified patent and that said Letters Patent is hereby corrected as shown below:

In the Claims

We ask that in claim 10 the text reading "first and second" be deleted and that the word "films" be replaced with the word "film". New claim 10 should read as follows:

10. The method of claim 7, wherein the etch stopper layer consists of an insulating or conductive film (O), which has an etch selectivity different from that of the interlayer insulating film.

Signed and Sealed this
Seventh Day of October, 2014

Michelle K. Lee
*Deputy Director of the United States Patent and Trademark Office*

UNITED STATES PATENT AND TRADEMARK OFFICE
CERTIFICATE OF CORRECTION

| | | |
|---|---|---|
| PATENT NO. | : 6,313,029 B1 | Page 1 of 1 |
| APPLICATION NO. | : 09/606874 | |
| DATED | : November 6, 2001 | |
| INVENTOR(S) | : Kim | |

It is certified that error appears in the above-identified patent and that said Letters Patent is hereby corrected as shown below:

In the Claims

Col. 6, Lines 39-42,

We ask that in claim 10 the text reading "first and second" be deleted and that the word "films" be replaced with the word "film". New claim 10 should read as follows:

10. The method of claim 7, wherein the etch stopper layer consists of an insulating or conductive film (O), which has an etch selectivity different from that of the interlayer insulating film.

This certificate supersedes the Certificate of Correction issued October 7, 2014.

Signed and Sealed this
Eleventh Day of November, 2014

Michelle K. Lee
*Deputy Director of the United States Patent and Trademark Office*